United States Patent
Bayerer et al.

(10) Patent No.: US 7,755,185 B2
(45) Date of Patent: Jul. 13, 2010

(54) ARRANGEMENT FOR COOLING A POWER SEMICONDUCTOR MODULE

(75) Inventors: Reinhold Bayerer, Warstein (DE); Thomas Licht, Warstein (DE)

(73) Assignee: Infineon Technologies AG, Munich (DE)

( * ) Notice: Subject to any disclaimer, the term of this patent is extended or adjusted under 35 U.S.C. 154(b) by 171 days.

(21) Appl. No.: 11/536,843

(22) Filed: Sep. 29, 2006

(65) Prior Publication Data
US 2008/0079021 A1    Apr. 3, 2008

(51) Int. Cl.
*H01L 23/34* (2006.01)
(52) U.S. Cl. .............................. 257/714; 257/E23.051
(58) Field of Classification Search ................. 438/122; 257/706, 712, 714, E23.051
See application file for complete search history.

(56) References Cited

U.S. PATENT DOCUMENTS

| | | |
|---|---|---|
| 4,170,472 A | 10/1979 | Olsen et al. |
| 5,221,558 A | 6/1993 | Sonuparlak et al. |
| 5,347,426 A | 9/1994 | Dermarkar et al. |
| 5,402,004 A | 3/1995 | Ozmat |
| 5,406,029 A | 4/1995 | Cook |
| 5,455,118 A | 10/1995 | Cook |
| 5,480,676 A | 1/1996 | Sonuparlak et al. |
| 5,524,697 A | 6/1996 | Cook |
| 5,524,699 A | 6/1996 | Cook |
| 5,580,643 A | 12/1996 | Kennedy et al. |
| 5,672,433 A | 9/1997 | Cook |
| 5,682,594 A | 10/1997 | Kennedy et al. |
| 5,796,049 A | 8/1998 | Schneider |
| 5,966,291 A | 10/1999 | Baumel et al. |
| 6,016,007 A | 1/2000 | Sanger et al. |
| 6,245,442 B1 * | 6/2001 | Towata et al. ............... 428/614 |
| 6,745,823 B2 | 6/2004 | Brost |
| 6,844,621 B2 | 1/2005 | Morozumi et al. |
| 2001/0017763 A1 | 8/2001 | Kaufmann |
| 2004/0020231 A1 | 2/2004 | Nakamura et al. |
| 2004/0217472 A1 * | 11/2004 | Aisenbrey et al. ........... 257/734 |

(Continued)

FOREIGN PATENT DOCUMENTS

DE    3937810 C1    3/1991

(Continued)

OTHER PUBLICATIONS

Eckardt et al., "A 100kW Automotive Powertrain DC/DC Converter with 25kW/dm3 by using SiC," PCIM (Power Conversion Intelligent Motion) Europe 2006, May 30-Jun. 1, 2006, pp. 185-190, Nürnberg, Germany.

(Continued)

*Primary Examiner*—David A Zarneke
*Assistant Examiner*—Jenny L Wagner
(74) *Attorney, Agent, or Firm*—Coats & Bennett, P.L.L.C.

(57) ABSTRACT

An arrangement for cooling a power semiconductor module, the power semiconductor module having a substrate with a ceramic plate and may have a metallization thereon, the arrangement has a container for the intake of a coolant with a heat-conducting plate; the heat-conducting plate having two sides, one side joined to the metallization of the substrate and the other side being in contact with the coolant; wherein the heat-conducting plate is made of materials having a metal matrix composite (MMC) material with a filling content, which results in a thermal expansion of below that of copper.

50 Claims, 5 Drawing Sheets

U.S. PATENT DOCUMENTS

| | | |
|---|---|---|
| 2005/0181209 A1 | 8/2005 | Karandikar |
| 2006/0000591 A1* | 1/2006 | Adams et al. ............... 165/185 |
| 2007/0023481 A1 | 2/2007 | Heeb et al. |

FOREIGN PATENT DOCUMENTS

| | | | |
|---|---|---|---|
| DE | 19515909 | A1 | 10/1996 |
| DE | 19647590 | A1 | 5/1998 |
| DE | 19735531 | A1 | 2/1999 |
| DE | 102004054063 | B3 | 11/2004 |
| EP | 0291441 | A1 | 11/1988 |
| EP | 0437169 | A1 | 7/1991 |
| EP | 0508717 | A1 | 10/1992 |
| EP | 0514946 | A2 | 11/1992 |
| EP | 0838988 | A2 | 4/1998 |
| EP | 1564516 | A2 | 8/2005 |
| WO | 92/12108 | A1 | 7/1992 |
| WO | 92/13689 | A2 | 8/1992 |
| WO | 93/20018 | A2 | 10/1993 |
| WO | 99/21805 | A2 | 5/1999 |
| WO | 2006/033436 | A1 | 3/2006 |

OTHER PUBLICATIONS

Franke et al., "Electrified Power Train—Challenges and Opportunities for the Electrical Industry," 11th European Conference on Power Electronics and Applications, Sep. 11-14, 2005, pp. 1-12, Dresden, Germany.

Guth et al., "Improving the Thermal Reliability of Large Area Solder Joints in IGBT Power Modules," 4th International Conference on Integrated Power Systems, Jun. 2006, pp. 1-5, Naples, Italy.

Schutze et al., "Further Improvements in the Reliability of IGBT Modules," IEEE Industry Applications Conference 1998, Oct. 12-15, 1998, pp. 1022-1025, vol. 2, St. Louis, Missouri, US.

Tadros et al., "Ring Shaped Motor-Integrated Electric Drive for Hybrid Electric Vehicles," 10th European Conference on Power Electronics and Applications, Sep. 2-4, 2003, pp. 1-10, Toulouse, France.

Yamada et al., "The Latest High Performance and High Reliability IGBT Technology in New Packages with Conventional Pin Layout," PCIM (Power Conversion Intelligent Motion) Europe 2003, May 21-23, 2003, pp. 1-5, Nürnberg, Germany.

* cited by examiner

ARRANGEMENT FOR COOLING A POWER SEMICONDUCTOR MODULE

TECHNICAL FIELD

The present invention relates generally to power semiconductor modules, and more particularly to an arrangement for cooling a power semiconductor module.

BACKGROUND

Power semiconductor modules comprise a semiconductor package and at least two power semiconductor chips mounted on one or more substrates within the package. The power semiconductor chips usually comprise power electronic circuits such as rectifier bridges, DC-links, IGBT inverters, drivers, control units, sensing units, half bridge inverters, AC-DC converters, DC-AC converters, DC-DC converters, bidirectional hybrid switches, and more.

In case of a plurality of substrates, interconnections from one substrate to another are provided within the package. As shown in FIG. 1, a power semiconductor module 10 comprises as a substrate an insulating ceramic plate 14 having a metallization 15 and 16 on each side of the ceramic plate, but in some case, only one metallization 15 may be sufficient. At the top side, the power semiconductor chips 12 are joined to the substrate by any known joining mechanism, e.g., soldering 13. At the bottom side, the substrate is joined to a base plate 18 by any known joining mechanism, e.g., soldering 17. As the power electronic circuits 12 of the power semiconductor module generate heat during operation, the module needs to be mounted on a cooling arrangement 19, such as a heat exchange arrangement or a heat sink for example. Between heat sink and module thermally conductive grease is applied.

Accordingly, efficient heat transfer between the module and the cooling arrangement is required. For this reason, many kinds of material are used for forming the different plates, or layers, of the module, as well as various assembling techniques for joining such plates together. For example, ceramics such as $Al_2O_3$, $AlN$, $Si_3N_4$ may be used as the insulating material for the substrate, and copper or aluminium is bonded to the ceramic by the known Direct Copper Bonding (DCB), Active Metal Brazing (AMB), or Direct Aluminium Bonding (DAB) methods. Copper thickness ranges, for example, from 0.1 mm to 0.6 mm and the ceramic thickness ranges, for example, from 0.2 mm to 2 mm. If the substrate is soldered to the base plate, a copper or aluminium metallization is formed on both sides of the ceramic substrate. Depending on the application of the power semiconductor module, substrates can also be Ni-, Ag-, Pd-, Pt-, W-, Mo-, Mg-, Au-, Ti, Cr-, Al- (in case of Cu metallization for gluing) plated. Combinations of these materials in multilayer plating like Ni/Au, NiPdAg-, Au-, Ni/Ag-, Ni/Pd-, NiPdAg-, Ni/Au-plating, etc. are also applied. If the metallization is aluminium, plating like Ni-, Ni/Ag-, Cu-, Cu/Ni/Au-, Cu/Ag-, Ni/Pd-, NiPdAg-, Ni/Au-, Ti/Ni-, Ti/Ni/AgCr/Ni-, Cr/Ni/Ag-plating is a requirement in case of soldering.

In operation of the power semiconductor modules, the joining layers between the chips and the substrate(s), and that between the substrate(s) and the base plate are subject to thermal-mechanical stress. The modules are expected to withstand a high number of thermal cycles, i.e., the number of ups and downs of temperature over the respective temperature swing. Power semiconductor chips operate at junction temperatures of typically below 125° C. or 150° C. Junction temperature is the temperature of the semiconductor die within a semiconductor device package, e.g. a module.

However, certain applications such as automotive applications require a junction temperature higher than that of conventional cases. For instance, in hybrid vehicles, since it is wished to use the coolant for cooling the combusting engine also for cooling the power semiconductor modules, the junction temperature for the power semiconductor chips may be as high as 175° C. or even 200° C. A result of this high junction temperature is that, at the substrate, the operation temperature is typically around 110° C. and can reach up to 140° C. Therefore, the joining layer between the substrate and the base plate would be subject to this substrate temperature on the substrate side and to the temperature of the coolant on the baseplate side. To be exact, the base-plate side of the joining layer is subject to the temperature of the coolant plus some 10° C., which results from the thermal impedance from the substrate to the base plate and coolant. Consequently, it is expected that, in hybrid electric vehicles, the joining layer between the substrate and the base plate could experience a far wider range of temperature than in the case of conventional applications—the temperature swing here can be 30° C. to 60° C. more, which is roughly double of the temperature swing as found in conventional cases. Since the life time of the module in number of temperatures cycles decreases almost exponentially with the temperature swing and/or according to $1/\Delta T^x$, with x>1, the number of achievable temperature cycles of the power semiconductor module would be significantly reduced in such automotive application.

Accordingly, there is a need to extend the lifetime of such modules.

SUMMARY

An arrangement for cooling a power semiconductor module is provided, the power semiconductor module may having a substrate comprising a ceramic plate and a metallization thereon. The arrangement may comprise a container for the intake of a coolant comprising a heat-conducting plate; the heat-conducting plate may have two sides, one side joined to the metallization of the substrate and the other side being in contact with the coolant; wherein the heat-conducting plate can be made of materials comprising a metal matrix composite (MMC) material with a filling content such that the thermal expansion of the heat-conducting plate is below that of Copper, which has a thermal expansion of 17 ppm/K (=17 μm/m*K).

Alternatively, an arrangement for cooling a power semiconductor module is provided, the power semiconductor module having a substrate comprising a ceramic plate. The arrangement may comprise a container for the intake of a coolant comprising a heat conducting plate; the heat-conducting plate may have two sides, one side joined to the ceramic plate of the substrate and the other side being in contact with the coolant; wherein the heat-conducting plate can be made of materials comprising a metal matrix composite (MMC) material with a filling content such that the thermal expansion of the heat-conducting plate is below that of Copper, which has thermal expansion of 17 ppm/K (=17 μm/m*K).

BRIEF DESCRIPTION OF THE DRAWINGS

The present invention can be better understood with reference to the following drawings and description. The components in the figures are not necessarily to scale, emphasis being instead placed upon illustrating the principles of the invention. Moreover, in the figures, like reference numerous designate corresponding parts. In the drawings:

FIG. 7 is a three-dimensional view of a multiple-segment heat sink, wherein each segment comprises a heat-conducting plate and the multiple plates are interconnected by channels there between;

DETAILED DESCRIPTION

Figure 1:
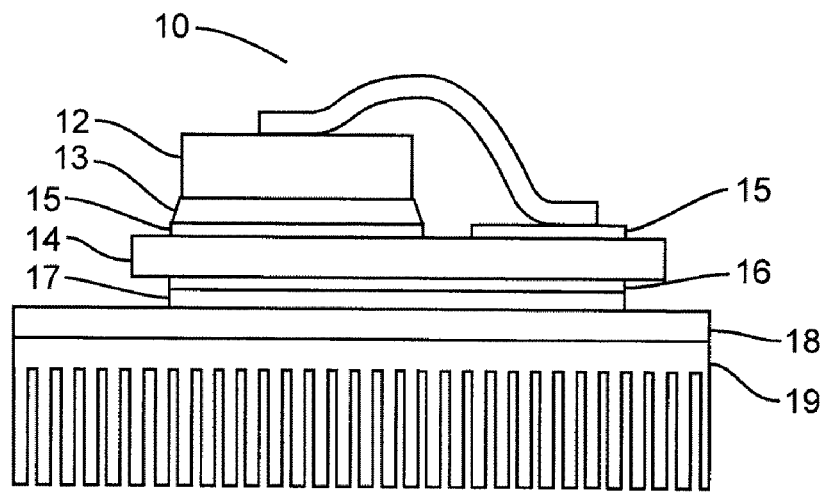
FIG. 1 is a cross-sectional view of a prior art power semiconductor module having a base plate mounted on a heat sink wherein thermally conductive grease is arranged between the baseplate and heat sink.

As already discussed above, in the prior art power semiconductor module shown in FIG. 1, the base plate 18 interfaces the insulating substrate and the heat sink 19. To be more exact, the base plate 18 and thermally conductive grease interfaces the bottom metallization 16 of the substrate via a joining structure 17, the joining structure being for example soldering. The substrate 14 is a plate formed of ceramics such as $Al_2O_3$, AlN, $Si_3N_4$. Metallization 15 and 16 made of copper or aluminium or any other kinds of commonly used metal is bonded to both sides of the ceramic plate by any of known methods, such as DCB-, AMB-, or DAB-method. In addition, the substrate can also be plated, e.g. Ni-, Ag-, Pd-, Pt-, W-, Mo-, Mg-, Au-, Ti, Cr-, Al- (in case of Cu metallization for gluing) plated. Combinations of these materials in multilayer plating like Ni/Au, NiPdAg-, Au-, Ni/Ag-, Ni/Pd-, NiPdAg-, Ni/Au-plating, etc. may also be preferred. If the metallization aluminium, plating like Ni-, Ni/Ag-, Cu-, Cu/Ni/Au-, Cu/Ag-, Ni/Pd-, NiPdAg-, Ni/Au-, Ti/Ni-, Ti/Ni/AgCr/Ni-, Cr/Ni/Ag-plating may be used. The base plate may be made of copper, AlSiC, MMC, or any other known material. The base plate can be mounted on the heat sink, which is made of, for instance, aluminium or aluminium alloys.

For automotive applications such as the hybrid vehicle mentioned above, an effective way for cooling the module is to share the coolant between the combustion engine and a power semiconductor module is to replace the heat sink mounted to the base plate by a liquid-cooled cooler and run the coolant of the combustion engine through this cooler. However, the material constraint has to be considered with respect to the liquid and the other material exposed to the liquid within the cooling system. As aluminium is already part of the combustion engine and the gear box and is highly resistant to corrosion, the preferred material choice for the cooler is therefore aluminium or its alloys. Nevertheless, as aluminium has a high CTE (26 ppm/K, higher than that of copper), the cycling capability of the joining layer between a copper-ceramic substrate/copper metallization and an aluminium heat sink could be unsatisfactory.

Figure 2:
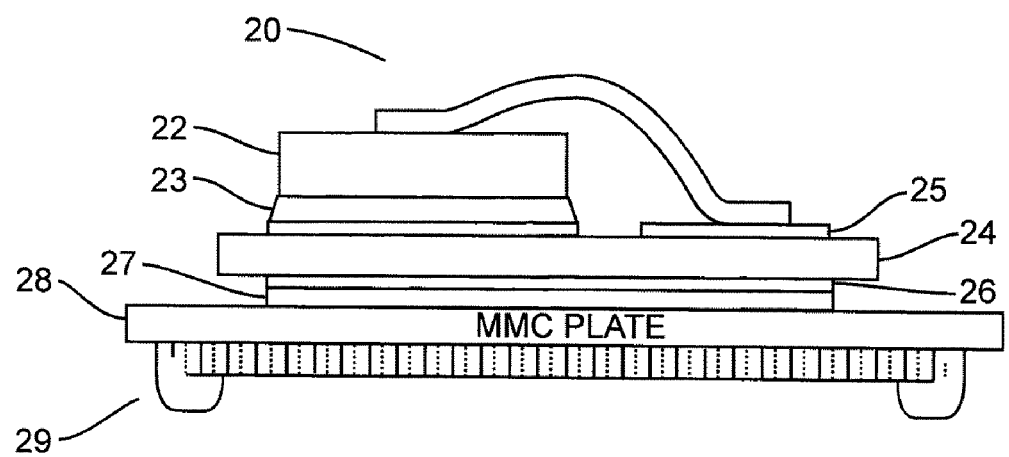
FIG. 2 is a cross-sectional view of a first example of an arrangement for cooling a power semiconductor module comprising a substrate with metallization on both sides.

FIG. 2 is an arrangement for cooling a power semiconductor module according to an embodiment. For the sake of simplicity, terminals, potting, and enclosure of the power semiconductor module are not shown. Significantly different from the prior art power semiconductor module 10 of FIG. 1 is that the base plate 18 appearing in has been replaced by a cooler 29. The cooler 29 is of a container type for the intake of a coolant. The cooler 29 comprises at least one heat-conducting plate 28, which has two sides. One side of the heat-conducting plate 28 is joined to the bottom metallization 27 of a substrate 24 of a power semiconductor module 20 via a joining 27, the joining techniques to be discussed below. The other side is in contact with the coolant in the heat sink. This heat-conducting plate comprises (or, as in the present example, is made of) a metal matrix composite (MMC) material with a filling content, which results in a low thermal expansion, lower than that of Copper and, possibly, higher than that of generally used MMC materials with a high filling content. The range of thermal expansion of the plate is below 17 ppm/K and may be greater than 8 ppm/K or is, e.g., between 10 and 12 ppm/K, between 13 and 16 ppm/K, or between 11 and 13 ppm/K.

The container has one or more inlet and one or more outlet for the coolant. The coolant may be any known types, such as water and for the purpose outlined above usually water containing additives (e.g., glycol) for preventing freezing below 0° C. The liquid coolant may come from and/or flow to the cooling system for cooling the combusting engine and/or transmission of an automotive vehicle. The substrate 24 is again a plate formed of ceramics such as $Al_2O_3$, AlN, $Si_3N_4$. Metallizations 25 and 26 are made of copper or aluminium or any other kinds of commonly used metal is bonded to both sides of the ceramic plate by any of known methods, such as DCB, AMB, DAB, or regular brazed metal method. In addition, the substrate can also be Ni-, Ag-, Pd-, Pt-, W-, Mo-, Mg-, Au-, Ti, Cr-, Al- (in case of Cu metallization for gluing) plated. Combinations of these materials in multilayer plating like Ni/Au, NiPdAg-, Au-, Ni/Ag-, Ni/Pd-, NiPdAg-, Ni/Au-plating, etc. are also applied. If the metallization is aluminium, plating like Ni-, Ni/Ag-, Cu-, Cu/Ni/Au-, Cu/Ag-, Ni/Pd-, NiPdAg-, Ni/Au-, Ti/Ni-, Ti/Ni/AgCr/Ni-, Cr/Ni/Ag-plating may be used.

Figure 3:
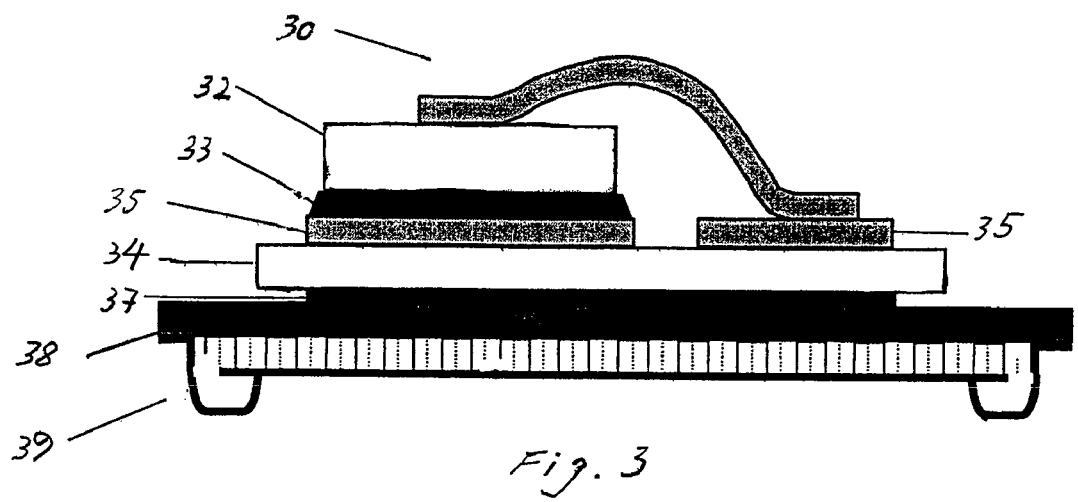
FIG. 3 is a cross-sectional view of another example of an arrangement for cooling a power semiconductor module comprising a substrate with metallization on only one side.

FIG. 3 is another arrangement for cooling a power semiconductor module according to an embodiment. This arrangement is similar to that of FIG. 2 except for the bottom metallization 26. In the arrangement of FIG. 3, the substrate does not have a metallization bonded to the bottom side thereof; thus, the bottom side of the heat-conducting plate 38 is directly joined to the ceramic plate 34 of the substrate. The heat-conducting plate 38 is made of a metal matrix composite (MMC) material with a filling content, which results in a low thermal expansion, lower than that of Copper.

In the cooling arrangements shown in FIG. 2 and FIG. 3, the metal matrix composite (MMC) material of the heat-conducting plate 28 may use aluminium or aluminium alloy as matrix. The matrix is filled by filler material such as SiC powder, carbon graphite, carbon-nano-pipes, or pyro-electric-graphites, etc. or a mixture of any of these kinds. The thermal expansion of such types of filler material measures a few μm/m*K (ppm/K), which allow to tune the CTE of the MMC to any value between 8 ppm/K to that of the matrix metal, i.e. Al or Cu by the filling ratio. In some cases, the matrix is filled by 10% to 50% (volume %) of such filling material. The filling ratio may also be 30% to 40% (volume %). By homogenously mixing this metal matrix composite material, the coefficient of thermal expansion (CTE) of the metal matrix composite material becomes homogenous. For example, the respective CTE may be in the range of 11 to 13 μm/m*K, or set to 12 μm/m*K. The thickness of the heat-conducting plate may vary, depending on the functions to be integrated in the overall power semiconductor module. In some instances, this thickness may range from 1 mm to 20 mm. The heat-conducting plate made of this kind, i.e. with this range of low filling content of metal matrix composite material can be manufactured by a kind of "injection molding": Liquid metal or metal alloy (such as liquid aluminium or aluminium alloy) and powder (SiC, carbon graphite, carbon-nano-pipes, pyro-electric-graphites, etc.) are injected into a chamber to form a desired shape. Due to the limited steps involved in this process and the high speed of the process, manufacturing cost can be significantly reduced, compared to the manufacturing of prior art MMC base plates, i.e. generally used MMC materials with a high filling content.

Figure 5:
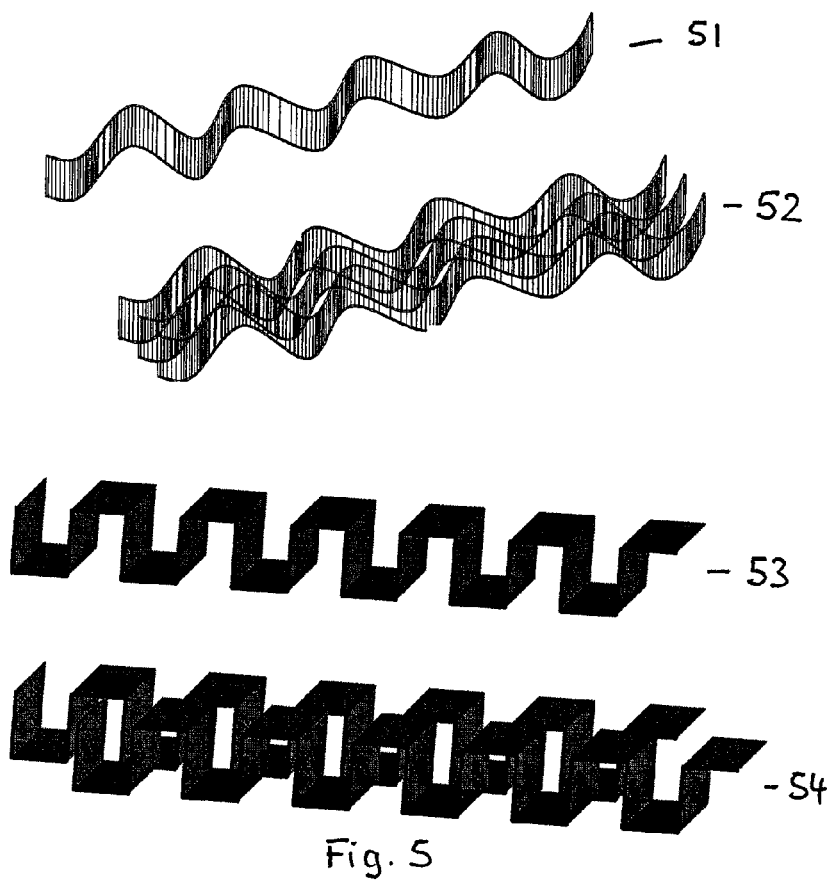
FIG. 5 is a three-dimensional view of single a ribbon or multiple ribbons to be joined to the heat-conducting plate to act as cooling fins.

As discussed above, in terms of automotive applications, aluminium or aluminium alloy is a suitable material for the heat sink, although other known materials are applicable as well. The heat sink may contain fin structures joined to the bottom side of the heat-conducting plate, inside the container. Aluminium or aluminium alloy can be stamped and then formed into a single ribbon 51 or multiple wavy ribbons 52 or a single meander 53 or multi-meander structure 54, as shown in FIG. 5 while other shapes or configurations for the cooling fins are also applicable. The container, also, may be made of aluminium or aluminium alloy. For instance, the container may be formed out of a thin aluminium or aluminium alloy sheet. Therefore, advantageously, the heat-conducting plate, the fin structures and the container can be conveniently joined together by an aluminium brazing technique.

The top side of the heat-conducting plate serves as a carrier for the substrate of the power semiconductor module and other parts on the module. This top side can be joined to the substrate of the power semiconductor module by various techniques. Some of the techniques are described below.

One joining technique to allow for a large number of thermal cycles is gluing by thermally conductive adhesives with a thermal conductivity higher than 1 W/mK, 2 W/mK, or higher than 5 W/mK. The adhesive may be one out of the group of: silicone adhesives, epoxies or Thermoplastic adhesives or other adhesives with glass temperatures above 140° C. In the arrangement of FIG. 3 the bare ceramic becomes glued to the heat-conducting plate of the heat sink. Thus, no further plating or surface treatment of the heat sink is necessary.

Another joining technique is soldering. For a solder joint, lead free solder may be used. A SnAg (3.5) alloy, SnAg (20), or, for example, any one out of the materials in the table in U.S. Pat. No. 4,170,472A1 is possible. These kinds of solder result in a maximum lifetime for the solder with respect to thermal cycling. Other examples of solder with a lead content are SnPb50, Sn36Pb63Ag1, Sn37Pb63, Pb95Sn4Ag1 for example. The aluminum surfaces to be soldered may be plated by Ni-, Ni/Ag-, Cu-, Cu/Ni/Au-, Cu/Ag-, Ni/Pd-, NiPdAg-, Ni/Au-, Ti/Ni-, Ti/Ni/AgCr/Ni-, Cr/Ni/Ag-plated. Any other plating material common for soldering can be used. The substrate bottom side may have bare copper bonded to the ceramic. Activation may be done before soldering. Soldering may be performed with a vacuum soldering process. Activation of the surfaces to be soldered may be done, either by activating atmosphere or by flux.

Figure 4:
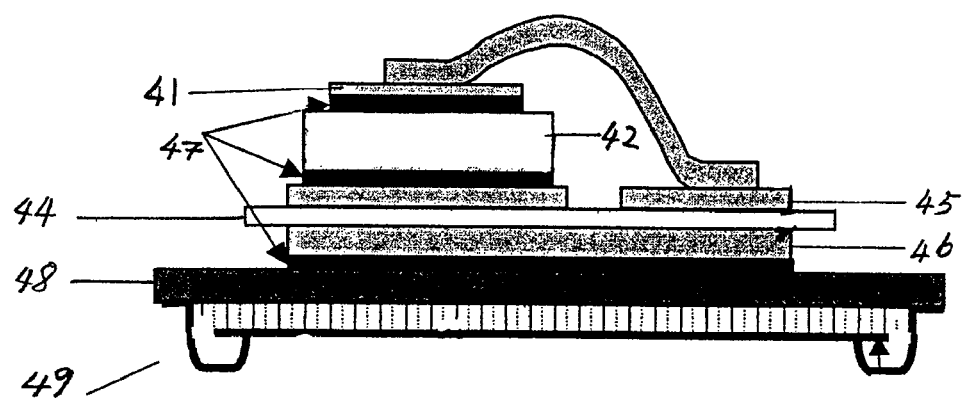
FIG. 4 is a cross-sectional view of a another arrangement for cooling a power semiconductor module according to an embodiment, wherein the substrate is joined to the heat-conducting plate by a low temperature joining technology (LTJT)

Yet another technique for joining the substrate(s) to the cooler is the so-called Low Temperature joining Technique (LTJT) as illustrated in FIG. 4. LTJT is a sintering technique using silver paste and is normally performed at 230° C. and under a pressure of around 30 Mpa. To facilitate a joining 47 by LTJT, a cooler 49 may be plated with Ni-, Ni/Ag-, Cu-, Cu/Ni/Au-, Cu/Ag-, Ni/Pd-, NiPdAg-, Ni/Au-, Ti/Ni/Au-, Ti/Ni/Ag, Cr/Ni/Au-, Cr/Ni/Ag-. A substrate 46 has, for example, either the bare Cu metallization or is Ni—Au, Ag-, Pd-, Pt-, W-, Mo-, Mn-, Au-plated. If the metallization is aluminium, plating like Cu—Ti/Ni/Au-, Ti/Ni/Ag, Cr/Ni/Ag-, Cr/Ni/Au—Ni/Au-, Ni/Ag or Cr/Ni/Ag can be used as examples and combinations of them. When LTJT is used for joining the substrate(s) and the cooler 49, the substrate 46 may also be joined together with power semiconductor chips 42 and optionally together with a sheet of metal 41 (copper for example) on top of the chips 42. In this way, the whole power semiconductor module 40 stack would be finished in one joining process.

Another type of the LTJT process is the sintering at a temperature range from 150° C. to 200° C., which lowers the joining temperature to be within or close to the operating range of the power semiconductor module. At around this joining temperature, the thermal-mechanical stress within the joining layers is zero with respect to CTE mismatch, Therefore, such low temperature joining technique results in a further stress reduction during operation.

For the application of LTJT joining technique, support structures, such as a comb structure, may be incorporated into the inside of the cooler, to help withstand the pressure of the sintering process.

Another joining technique may be one with special high temperature solders whose melting point exceeds 400° C. after the assembly.

Plating of substrate surface may also be done by Ni, Ni—Au or other common solder interfaces, e.g. Cu. The plating may be done selectively just at the area to be soldered or completely outside the heat sink. Selectively sputtered or evaporated metallization like the metal layers for soldering on Aluminum discussed above, may also be used in a technique to generate the solderable surface. Similar techniques are useful to generate a surface for the LTJT or alloying.

In addition to the heat-conducting plate made of metal matrix composite and the joining methods described above, many techniques can be practiced to further improve the heat transfer from the power semiconductor chips to the heat sink and/or other performance and manufacturing issues of the power semiconductor module.

The substrates may be of the DCB, AMB, DAB, regular brazing type and ceramics may be of Al2O3, Si3N4, AlN, or the like. The ceramics may have optional additives (for example Zr, Y, Er, Nb, Nd) for higher mechanical strength and elasticity. Substrates of the high CTE types are preferably used, i.e. ceramic thickness as low as possible from the insulating requirement point of view (as low as 0.2 mm) and copper thickness as high as possible from the thermo-mechanical stress point of view (as high as 1 mm), typically from 0.3 mm to 0.6 mm.

Substrate corners or corners of the bottom metal on the substrate may be chamfered or rounded to reduce the thermo-mechanical stress at the corners of the substrates and the joining layers.

Figure 6:
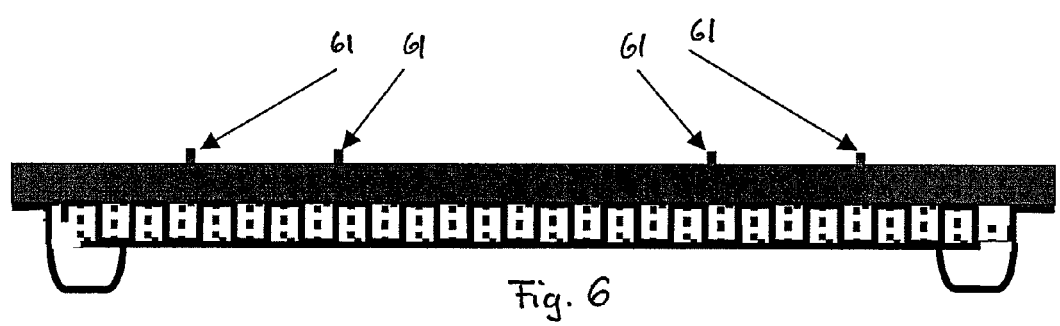
FIG. 6 is a cross-sectional view of another example of an arrangement for cooling a power semiconductor module comprising distance keepers to define the thickness of the solder layer joints.

Referring to FIG. 6, distance keeping holders 61 may be implemented in the solder layer by wire bumps. For instance, bumps may be made on the top side of a heat-conducting plate 68 of a cooler 69. Bumps may be integrated with the heat-conducting plate during the manufacturing process of the heat-conducting plate or at the brazing process. The integrated bumps help achieve a solderable surface during the post treatment (plating, sputtering, etc.) of the cooler for soldering.

The cooler may have a cooling structure inside to distribute the coolant from the inlet to the fin structures, to the heat-conducting plate, and to the outlet, in order to obtain a homogeneous temperature distribution on the heat-conducting plate. The cooler may have additional guiding walls inside the cooling structure for optimum distribution of the coolant.

Figure 7:
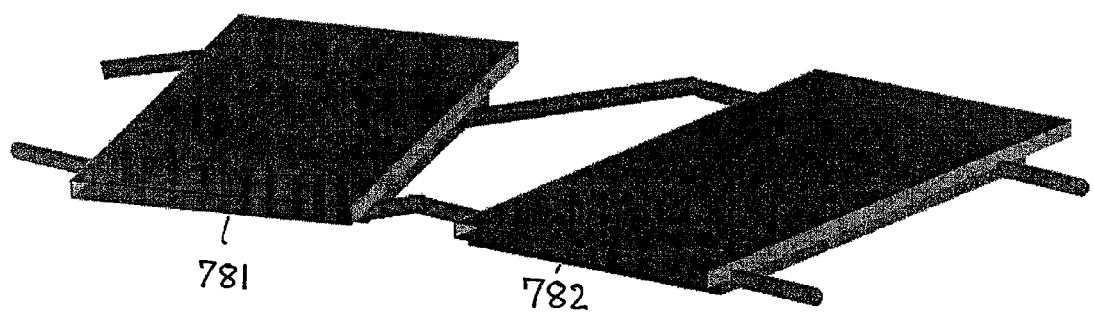

Referring to FIG. 7, a cooler may further comprise several such heat-conducting plates 781 and 782, each plate with its individual container underneath; the heat-conducting plates may have interconnecting channels thus forming a multi-segment cooler. Each segment may have an orientation different from that of the other segments, so as to be compatible with multi-segmented power modules with different orientations within the 3-dimensional space. The interconnecting channels for distributing coolant to different segments may be designed to have similar liquid inlet temperature for each segment.

A heat sink or the multi-segment heat sink may have means integrated for assembly of the whole modules in a car, the gear box or places suited for the power electronics of a hybrid vehicle. Such means may be just mounting holes for screwing the cooler to a reserved spot. Coolant connections of the cooler to the cooling system of the car, e.g. the cooling system of combustion engine, may be identical to common fittings in the vehicle. Hoses may serve as the interface.

Fin structures attached (or joined) to the inside of the cooler may be used, since they can, in many cases, significantly improve the cooling performance. Fins may be attached to the heat-conducting plate to enlarge the surface area and as such to draw more heat from the plate and distribute it into the coolant. The cross section and the density of the fins are optimized for heat transfer from the MMC-plate into the coolant. Aluminium or aluminium alloy fins may be attached to the aluminium or aluminium alloy container by an aluminium brazing technique, which is a common practice in the manufacturing of automotive heat exchangers. The implementation of fins may also be part of the molding process of the heat-conducting plate, determined by the shape of the molding tool.

Fins may be made of stamped and bent aluminium or aluminium alloy, and may be take any known form, wavy ribbons as shown in FIG. 5 being an example. Either a single ribbon 51 or a stack (multiple) of ribbons 52 is possible. The wavy structure of the ribbons and the thin wall of the container as well as the geometry thereof can be carefully chosen to allow room for accommodating the difference in elongation (CTE mismatch) between the ribbons, the containers, and the MMC-Plate. Other types of fin structures may be stamped out of aluminum or aluminium alloy and integrated into the cooler by aluminum brazing. For example, as shown in FIG. 5, ribbons with 90°-turning and multiple ribbons oriented in parallel enable coolant to follow a serpentine way inside the channels formed by the ribbons. Small cylinders or other three-dimensional pieces may also be used as fins.

In another example (not shown in the drawings) of an Aluminum-Graphite MMC (AlC) plate serving as a heat-conducting plate of the cooler, AlC is used which is a soft material and can easily bend when thermo-mechanical stress is generated due to the remaining mismatch of CTE between the substrate and the heat-conducting plate of the heat sink.

Figure 8:
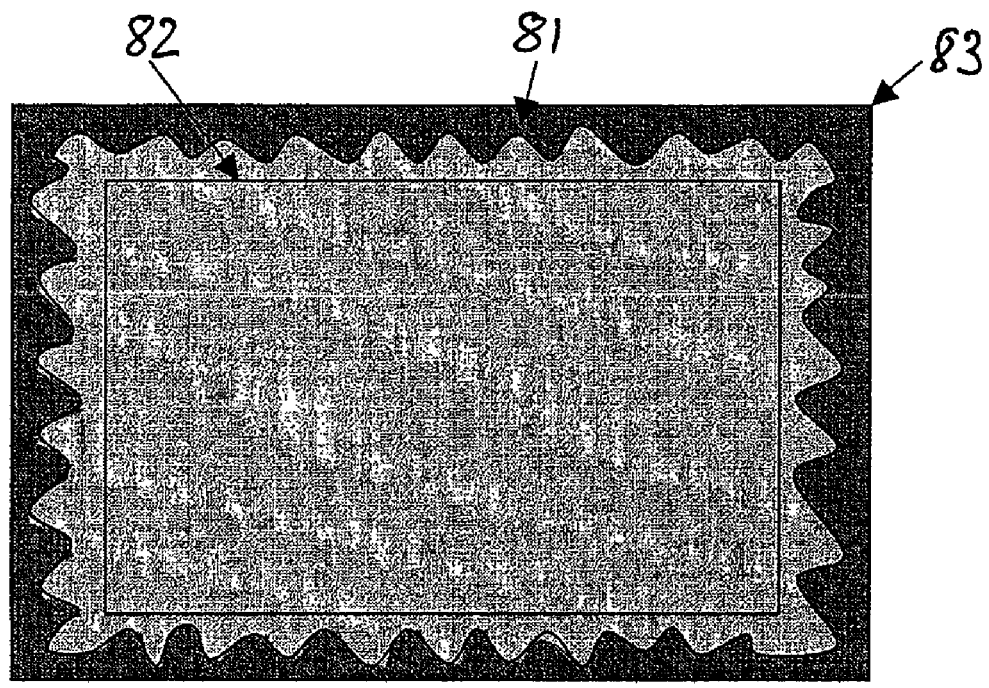
FIG. 8 is a cross-sectional view of another example of an arrangement for cooling a power semiconductor module comprising heat-conducting plate made from Aluminum-Graphite (AlC [Aluminum-Carbon]) MMC.
Figure 8:
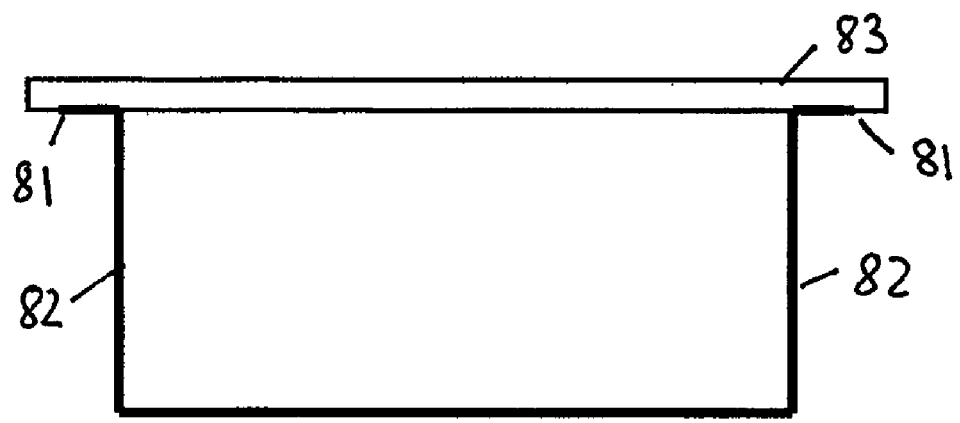

FIG. 8 shows another cooler with a conducting plate 83. A container, e.g. 29 is joined to the heat conducting plate 83 along a meander line 81. Reference 82 indicates the border of coolant. The ribbon type fins inside the heat sink and the container are flexible structures themselves. These factors mean that the whole bottom structure (container and fins) of the power semiconductor module is able to elongate differently according to their difference in thermal expansion as there is no straight long line of joint between the different materials; thus reducing the thermo-mechanical stress.

Figure 9:
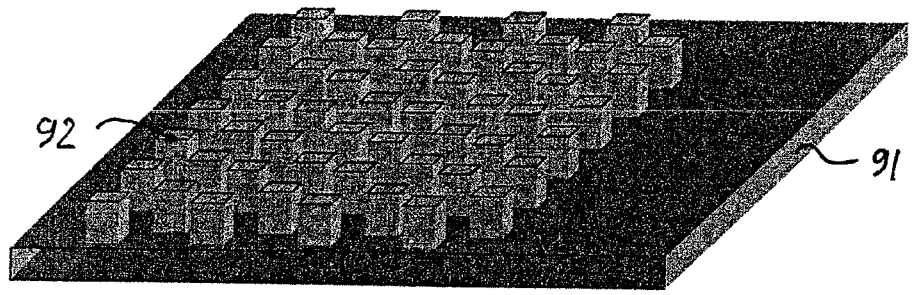
FIG. 9 is a three-dimensional view of a MMC plate having cooling fins as integral part.

FIG. 9 shows in a three-dimensional view a MMC plate 91 having cooling fins 92 as integral part. In this example, the fins have the form of rectangular tubes or a rhombic form but may have any other known form.

Figure 10:
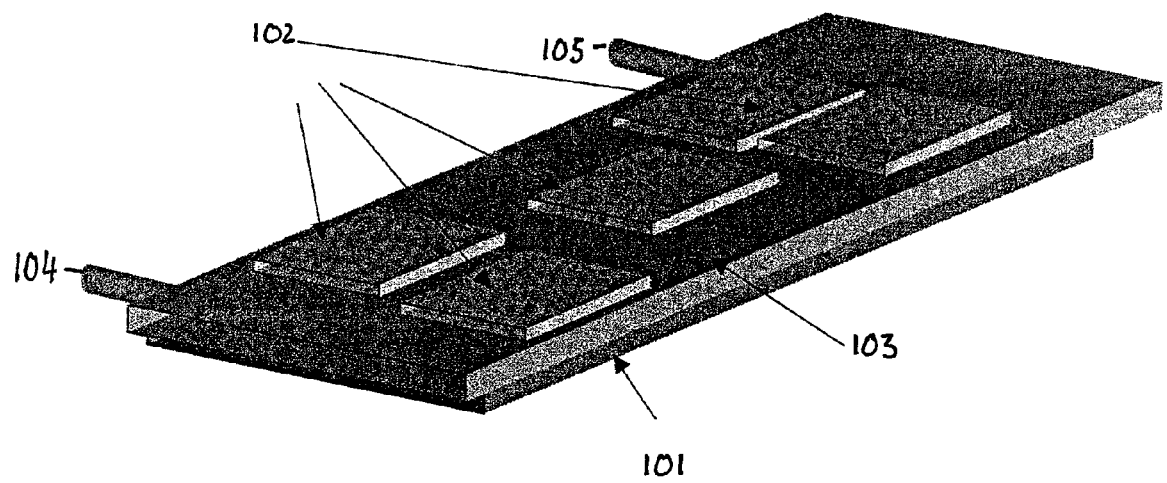
FIG. 10 is a three-dimensional view of a cooler with selective surface finish to join substrates.

FIG. 10 is a three-dimensional view of a cooler 101 with selective surface finish 102 to join multiple substrates. The selective surface finish is arranged on an MMC plate 103 underneath the respective substrates. The cooler 101 is a container defining a chamber having a coolant inlet 104 and a coolant outlet 105.

As can be seen from the above, the present invention may provide several advantages. Firstly, the metal matrix composite (MMC) material for making the interfacing plate (heat-conducting plate) of the arrangement provides a low coefficient of thermal expansion. Secondly, the heat-conducting plate made of such metal matrix composite (MMC) material can be manufactured by processes which are faster and less expense than prior art manufacturing methods for power module base plates. Thirdly, in terms of automotive applications, aluminium or aluminium alloy is a preferable material for the arrangement. When the surface of the heat-conducting plate, the fin structures and the container are made of aluminium or aluminium alloy, they can be joined together by an aluminium brazing technique, which is easy to handle.

Known types of metal matrix composite are, for example, AlSiC, CuMo, CuW, CuSiC, and AlC. The low filling content MMC has a reduced coefficient of thermal expansion (CTE) of around 12 μm/m·K (ppm/K) and can therefore reduce the CTE mismatch between the substrate and the heat-conducting plate below that of a module with copper base plate, but offering Aluminum (Aluminum alloy) as cooler material. Thus, thermal-mechanical stress in the joining layer between the substrate and the base plate can be sufficiently reduced, a significantly high number of temperature cycles can be achieved and automotive requirements in terms of heat sink material is met for the power semiconductor module.

What is claimed is:

1. An arrangement for cooling a power semiconductor module, the power semiconductor module having a substrate comprising a ceramic plate and a metallization thereon, said arrangement comprising:
    a container for the intake of a coolant comprising a heat-conducting plate;
    said heat-conducting plate having two sides, one side joined to the metallization of the substrate and the other side being in contact with the coolant;
    wherein said heat-conducting plate is made of materials comprising a metal matrix composite (MMC) material with a filling content such that the thermal expansion of the heat conducting plate is homogenous and in the range of 11 to 16 ppm/K.

2. The arrangement according to claim 1, wherein said metallization comprises at least one of the materials from the group of copper and aluminum.

3. The arrangement according to claim 1, wherein said ceramic plate comprises at least one of the materials from the group of $Al_2O_3$, AlN, and $Si_3N_4$.

4. The arrangement according to claim 1, wherein the container further comprises at least an inlet and an outlet for the coolant.

5. The arrangement according to claim 1, further comprising one or more cooling fins, ribbons, or meander-structures joined to said other side of said heat-conducting plate.

6. The arrangement according to claim 1, wherein said metal matrix composite (MMC) material comprises aluminum or an aluminum alloy as matrix.

7. The arrangement according to claim 1, wherein the filling content of said metal matrix composite (MMC) material is at least one of SiC, carbon graphite, carbon-nano-pipes, and pyro-electric graphite.

8. The arrangement according to claim 1, wherein said metal matrix composite (MMC) material is filled with 10 Vol % to 50 Vol % of said at least one of SiC, carbon graphite, carbon-nano-pipes, and pyro-electric graphite.

9. The arrangement according to claim 1, wherein said matrix composite (MMC) material is filled with 30 Vol % to 40 Vol % of said at least one of SiC, carbon graphite, carbon-nano-pipes, and pyro-electric graphite.

10. The arrangement according to claim 1, wherein the filling content of the said metal matrix composite (MMC) material is homogenously mixed.

11. The arrangement according to claim 1, wherein said heat-conducting plate has a thickness of from 1 mm to 20 mm.

12. The arrangement according to claim 1, wherein the surface of said one side of the heat-conducting plate is aluminum, copper or their alloys, respectively.

13. The arrangement according to claim 1, wherein the container is made of aluminum or an aluminum alloy.

14. The arrangement according to claim 5, wherein the cooling fins are made of aluminum or an aluminum alloy.

15. The arrangement according to claim 5, wherein said container and said cooling fins are made of aluminum or aluminum-alloy, and said heat-conducting plate, the cooling fins, and the container are joined by aluminum brazing.

16. The arrangement according to claim 1, further comprising a plurality of said heat-conducting plates, each plate having a respective container joined to said other side thereof, and said arrangement further comprising interconnecting channels between the containers.

17. The arrangement according to claim 1, further comprising the substrate joined to said one side of the heat-conducting plate with thermally conductive adhesives with a thermal conductivity higher than 1 W/mK.

18. The arrangement according to claim 17, wherein said substrate is glued to said one side of the heat-conducting plate with thermally conductive adhesives having a thermal conductivity higher than 2 W/mK.

19. The arrangement according to claim 17, wherein said substrate is glued to said one side of the heat-conducting plate with thermally conductive adhesives having a thermal conductivity higher than 5 W/mK.

20. The arrangement according to claim 19, wherein said substrate is glued to said one side of the heat-conducting plate with thermally conductive adhesives out of silicon adhesives or epoxies or other with glass temperatures above 140 degrees centigrade.

21. The arrangement according to claim 1, further comprising the substrate joined to said one side of the heat-conducting plate by a sintering technique using silver paste and performed at a temperature between 200 and 260 degrees centigrade and a pressure between 25 and 35 MPa.

22. The arrangement according to claim 17, wherein said substrate is glued to said one side of the heat-conducting plate with thermally conductive adhesives having a thermal conductivity higher than 5 W/mK, and wherein said substrate is joined to said one side of the heat-conducting plate by the sintering technique performed at a range from 150 degrees centigrade to 200 degrees centigrade.

23. The arrangement according to claim 1, further comprising the substrate joined to said one side of the heat-conducting plate by high temperature solders whose melting point exceeds 400 degrees centigrade after assembly.

24. The arrangement according to claim 1, wherein the cooler is connectable to the cooling system of a hybrid electric vehicle.

25. The arrangement according to claim 1, wherein said power semiconductor module comprises power electronic circuits containing anyone from the group of rectifier bridge, DC-link, IGBT inverter, driver, control units, sensing unit, half bridge inverter, AC-DC converter, DC-AC converter, matrix converter consisting of bidirectional hybrid switches.

26. An arrangement for cooling a power semiconductor module, the power semiconductor module having a substrate comprising a ceramic plate, said arrangement comprising:
a container for the intake of a coolant comprising a heat conducting plate;
said heat-conducting plate having two sides, one side joined to the ceramic plate of the substrate and the other side being in contact with the coolant;
wherein said heat-conducting plate is made of materials comprising a metal matrix composite (MMC) material with a filling content such that the thermal expansion of the heat conducting plate is homogenous and in the range of 11 to 16 ppm/K.

27. The arrangement according to claim 26, wherein a metallization joining the heat-conducting plate to the ceramic plate comprises at least one of the materials from the group of copper and aluminum.

28. The arrangement according to claim 26, wherein said ceramic plate comprises at least one of the materials from the group of $Al_2O_3$, AlN and $Si_3N_4$.

29. The arrangement according to claim 26, wherein the container further comprises at least an inlet and an outlet for the coolant.

30. The arrangement according to claim 26, further comprising one or more cooling fins, ribbons, or meander-structures joined to said other side of said heat-conducting plate.

31. The arrangement according to claim 26, wherein said metal matrix composite (MMC) material comprises aluminum or an aluminum alloy as matrix.

32. The arrangement according to claim 26, wherein the filling content of said metal matrix composite (MMC) material is at least one of SiC, carbon graphite, carbon-nano-pipes, and pyro-electric graphite.

33. The arrangement according to claim 26, wherein said metal matrix composite (MMC) material is filled with 10 Vol % to 50 Vol % of said at least one of SiC, carbon graphite, carbon-nano-pipes, and pyro-electric graphite.

34. The arrangement according to claim 26, wherein said metal matrix composite (MMC) material is filled with 30 Vol % to 40 Vol % of said at least one of SiC, carbon graphite, carbon-nano-pipes, and pyro-electric graphite.

35. The arrangement according to claim 26, wherein the filling content of the said metal matrix composite (MMC) material is homogenously mixed.

36. The arrangement according to claim 26, wherein said heat-conducting plate has a thickness of from 1 mm to 20 mm.

37. The arrangement according to claim 26, wherein the surface of said one side of the heat-conducting plate is aluminum, copper or their alloys, respectively.

38. The arrangement according to claim 26, wherein the container is made of aluminum or an aluminum alloy.

39. The arrangement according to claim 30, wherein the cooling fins are made of aluminum or an aluminum alloy.

40. The arrangement according to claim 30, wherein said container and said cooling fins are made of aluminum or aluminum-alloy, and said heat-conducting plate, the cooling fins, and the container are joined by aluminum brazing.

41. The arrangement according to claim 26, further comprising a plurality of said heat-conducting plates, each plate having a respective container joined to said other side thereof, and said arrangement further comprising interconnecting channels between the containers.

42. The arrangement according to claim 26, further comprising the substrate joined to said one side of the heat-conducting plate with thermally conductive adhesives with a thermal conductivity higher than 1W/mK.

43. The arrangement according to claim 42, wherein said substrate is glued to said one side of the heat-conducting plate with thermally conductive adhesives having a thermal conductivity higher than 2 W/mK.

44. The arrangement according to claim 42, wherein said substrate is glued to said one side of the heat-conducting plate with thermally conductive adhesives having a thermal conductivity higher than 5 W/mK.

45. The arrangement according to claim 42, wherein said substrate is glued to said one side of the heat-conducting plate with thermally conductive adhesives out of silicon adhesives or epoxies or other with glass temperatures above 140 degrees centigrade.

46. The arrangement according to claim 26, further comprising the substrate joined to said one side of the heat-conducting plate by a sintering technique using silver paste and performed at a temperature between 200 and 260 degrees centigrade and a pressure between 25 and 35 MPa.

47. The arrangement according to claim 42, wherein said substrate is glued to said one side of the heat-conducting plate with thermally conductive adhesives having a thermal conductivity higher than 5 W/mK, and wherein said substrate is joined to said one side of the heat-conducting plate by the sintering technique performed at a range from 150 degrees centigrade to 200 degrees centigrade.

48. The arrangement according to claim 26, further comprising the substrate joined to said one side of the heat-conducting plate by high temperature solders whose melting point exceeds 400 degrees centigrade after assembly.

49. The arrangement according to claim 26, wherein the cooler is connectable to the cooling system of a hybrid electric vehicle.

50. The arrangement according to claim 26, wherein said power semiconductor module comprises power electronic circuits containing anyone from the group of rectifier bridge, DC-link, IGBT inverter, driver, control units, sensing unit, half bridge inverter, AC-DC converter, DC-AC converter, matrix converter consisting of bidirectional hybrid switches.

* * * * *